(12) United States Patent
Isoda

(10) Patent No.: US 9,712,159 B2
(45) Date of Patent: Jul. 18, 2017

(54) DIFFERENTIAL SIGNAL DRIVING CIRCUIT

(71) Applicant: CANON KABUSHIKI KAISHA, Tokyo (JP)

(72) Inventor: Naoki Isoda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 94 days.

(21) Appl. No.: 14/565,178

(22) Filed: Dec. 9, 2014

(65) Prior Publication Data

US 2015/0188537 A1 Jul. 2, 2015

(30) Foreign Application Priority Data

Dec. 27, 2013 (JP) ................................. 2013-273172

(51) Int. Cl.
*H03K 17/00* (2006.01)
*H03K 17/687* (2006.01)
*H03K 19/0185* (2006.01)

(52) U.S. Cl.
CPC ..... *H03K 17/6872* (2013.01); *H03K 19/0185* (2013.01); *H03K 2217/0045* (2013.01)

(58) Field of Classification Search
USPC ....................................................... 327/108
See application file for complete search history.

(56) References Cited

U.S. PATENT DOCUMENTS

| 7,755,411 B2 | 7/2010 | Isoda | |
| 8,174,317 B2 | 5/2012 | Isoda | |
| 8,310,282 B2 * | 11/2012 | Behel | H03K 19/01851 326/86 |
| 9,362,915 B1 * | 6/2016 | Phillippe | H03K 19/0175 |
| 2011/0018633 A1 * | 1/2011 | Hsieh | H03F 3/005 330/253 |
| 2012/0162189 A1 * | 6/2012 | Ebuchi | H03K 19/00361 345/212 |

FOREIGN PATENT DOCUMENTS

JP 2007-134940 A 5/2007

* cited by examiner

*Primary Examiner* — Lincoln Donovan
*Assistant Examiner* — Patrick Chen
(74) *Attorney, Agent, or Firm* — Fitzpatrick, Cella, Harper & Scinto

(57) ABSTRACT

A differential driving circuit includes a source current source, a sink current source, an H-bridge circuit, an error detector unit and a circuit network. The H-bridge circuit is connected to the source current source and the sink current source, that has a first output terminal and a second output terminal, and that generates differential output from the first output terminal and the second output terminal. The error detector unit adjusts a common mode voltage at the first output terminal and the second output terminal of the H-bridge circuit by controlling at least one of the source current source and the sink current source. The circuit network is configured by resistors and capacitors connected to the first output terminal and the second output terminal of the H-bridge circuit.

6 Claims, 8 Drawing Sheets

DIFFERENTIAL SIGNAL DRIVING CIRCUIT

BACKGROUND OF THE INVENTION

Field of the Invention

The present invention relates to a differential signal driving circuit for signal transmission in low voltage differential signaling (LVDS).

Description of the Related Art

In LVDS transmission, Japanese Patent Laid-Open No. 2007-134940 discloses a differential signal driving circuit provided with a common feedback (hereinafter, CMFB) circuit for realizing good signal transmission. According to this Patent Document, a capacitor is inserted between a gate and a drain of an MOS transistor functioning as a current source, so that the phase margin at the pole of the transfer function is improved. However, as the external load capacitance of a transmission line increases, the position of the pole shifts toward the low frequency range. At that time, if the position of the pole is lowered to a frequency range corresponding to at least one time the amplitude gain of the open-loop transfer function of the CMFB circuit, the driving circuit may not have enough phase margin.

SUMMARY OF THE INVENTION

The present invention is directed to a differential signal driving circuit, including a source current source, a sink current source, an H-bridge circuit that is connected to the source current source and the sink current source, that has a first output terminal and a second output terminal, and that generates differential output from the first output terminal and the second output terminal, an error detector unit that adjusts a common mode voltage at the first output terminal and the second output terminal of the H-bridge circuit, and a circuit network configured by resistors and capacitors connected to the first output terminal and the second output terminal of the H-bridge circuit. The circuit network is configured such that one terminal of a first resistor and one terminal of a first capacitor are connected to the first output terminal of the H-bridge circuit, one terminal of a second resistor and one terminal of a second capacitor are connected to the second output terminal of the H-bridge circuit, one terminal of a third resistor is connected to the other terminal of the first resistor and the other terminal of the second resistor, one terminal of a third capacitor is connected to the other terminal of the first capacitor, the other terminal of the second capacitor, and the other terminal of the third resistor, and the other terminal of the third capacitor is connected to ground. The error detector unit is configured to control at least one of the source current source and the sink current source based on a voltage generated at a node where the other terminal of the third resistor and the one terminal of the third capacitor are connected to each other, and a reference voltage.

Further features of the present invention will become apparent from the following description of exemplary embodiments with reference to the attached drawings.

DESCRIPTION OF THE EMBODIMENTS

First Embodiment

Figure 1:
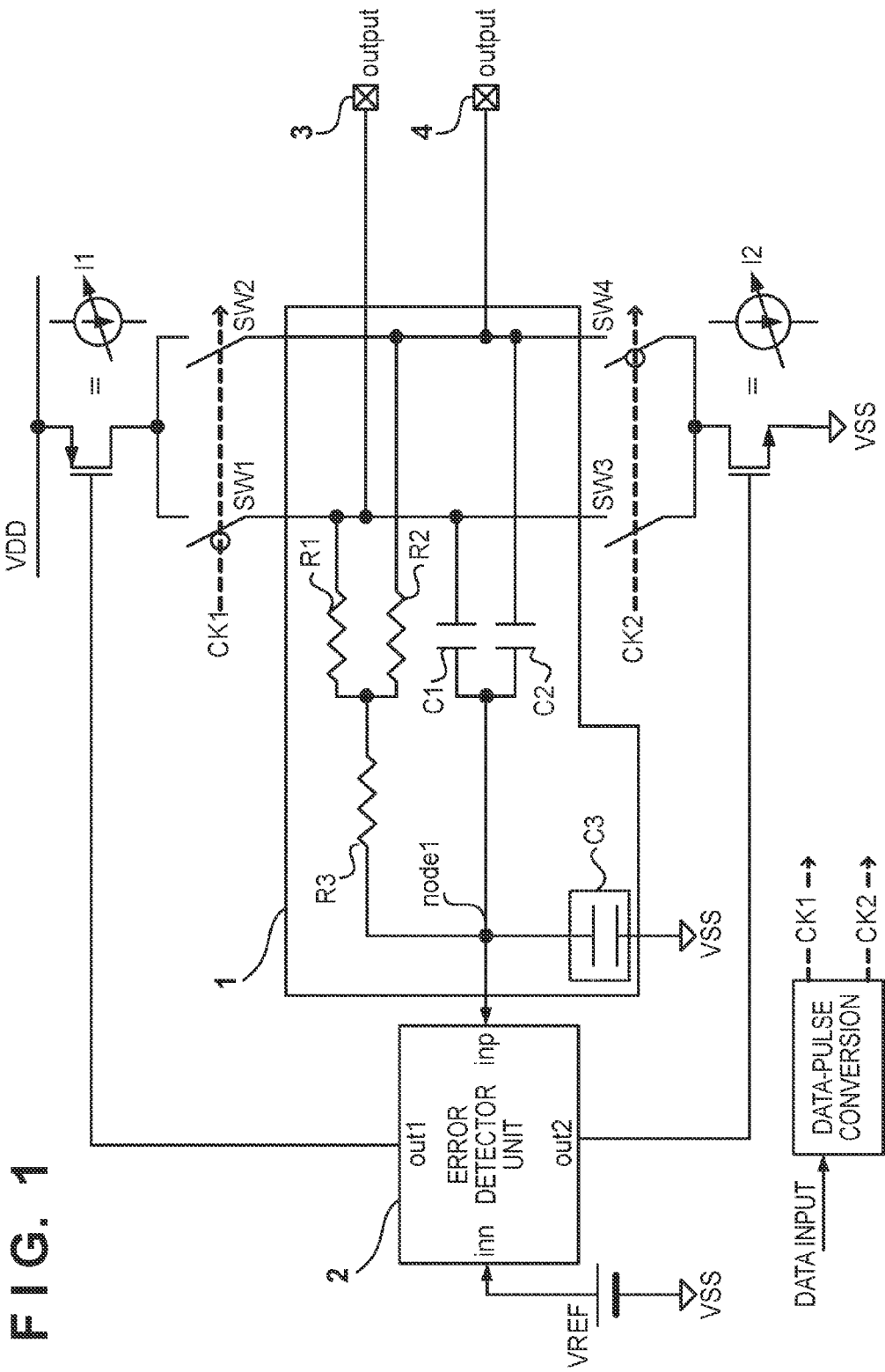
FIG. 1 is a view showing an example of the circuit diagram according to the first embodiment.

Hereinafter, the first embodiment of the present invention will be described with reference to the drawings. FIG. 1 is a diagram schematically showing a differential signal driving circuit. The driving circuit that generates differential output is shown as a switch circuit having switches SW1 to SW4. Terminals of the switches SW1 and SW3 are connected to each other, and terminals of the switches SW2 and SW4 are connected to each other. The switches SW1 to SW4 are controlled to be turned on and off in response to control signals CK1 and CK2. The switches SW1 and SW2 that are turned on and off in response to the control signal CK1 perform a complementary operation in which, when one of the switches is on, the other is off. The switches SW3 and SW4 that are turned on and off in response to the control signal CK2 perform a complementary operation in which, when one of the switches is on, the other is off. The switches SW1, SW2, SW3, and SW4 form an H-bridge circuit. The node at which the terminals of the switches SW1 and SW3 are connected to each other is referred to as a first output terminal 3 of the H-bridge circuit, and the node at which the terminals of the switches SW2 and SW4 are connected to each other is referred to as a second output terminal 4 of the H-bridge circuit. Terminals of the switches SW1 and SW2, on the side opposite from the side on which the switches SW1 and SW2 are respectively connected at the output terminals 3 and 4, are connected to one terminal of a source current source I1 configured by a pMOS transistor. The other terminal of the source current source I1 is connected to a power supply potential VDD. Terminals of the switches SW3 and SW4, on the side opposite from the side on which the switches SW3 and SW4 are respectively connected at the output terminals 3 and 4, are connected to one terminal of a sink current source I2 configured by an nMOS transistor. The other terminal of the sink current source I2 is connected to a ground potential VSS. In response to input data, a differential signal is generated from the output terminals 3 and 4 and drives a transmission line connected to each output terminal.

In the diagram, a block enclosed by the solid line is a circuit network 1 (CR circuit 1) configured by resistors and capacitors forming part of a common feedback (CMFB) circuit that controls a change in the common mode voltage based on negative feedback. One terminal of a first resistor R1 and one terminal of a first capacitor C1 are connected to the first output terminal 3 of the H-bridge circuit, and one terminal of a second resistor R2 and one terminal of a second capacitor C2 are connected to the second output terminal 4. The other terminals of the first and second resistors R1 and R2 are both connected to one terminal of a third resistor R3, and the first and second capacitors C1 and C2 are connected to a node at which one terminal of a third capacitor C3 and the other terminal of the resistor R3 are connected to each other. The node at which the other terminal of the resistor R3 and the one terminal of the capacitor C3 are connected to each other is referred to as a node1. The other terminal of the capacitor C3 is connected to a ground potential VSS.

The differential signal driving circuit is provided with an error detector unit 2. Output terminals out1 and out2 of the error detector unit 2 are respectively connected to control terminals (gate terminals) of the pMOS transistor and the nMOS transistor of the source and sink current sources I1 and I2. A reference voltage VREF is input to a first input terminal inn of the error detector unit 2, and the node1 of the CR circuit 1 is connected to a second input terminal inp. Note that the control signals CK1 and CK2 are signals corresponding to input data, and are signals generated by a data-pulse conversion circuit in accordance with the input data. Furthermore, an unshown load resistor (e.g., 100Ω) is connected between the first and second differential signal output terminals 3 and 4, on the receiving side via the transmission line. At that time, a capacitance load is parasitically generated at the transmission line when viewed from the output terminals 3 and 4.

Next, an operation in this embodiment will be described. A voltage generated at the first and second output terminals 3 and 4 is input to the CR circuit 1 forming part of the CMFB circuit. A differential voltage generated at the output terminals 3 and 4 is cancelled in the node1 of the CR circuit 1, but a common mode voltage is transmitted via the node1 to the error detector unit 2. The error detector unit 2 compares the reference voltage VREF and the voltage of the node1, and generates a control signal that adjusts the source current source I1, or the sink current source I2, or both of the source and sink current sources I1 and I2. At that time, for example, negative feedback control is performed such that, when a common mode voltage generated at the first and second output terminals 3 and 4 increases, the current value of the sink current source I2 relatively increases (or the current value of the source current source I1 decreases). As a result of this control, the common mode voltage converges on substantially the same voltage value as the reference voltage VREF.

In order to stabilize the common mode voltage, it is necessary to get a phase margin of 60° or more of a feedback signal in the open-loop according to the CMFB. That is to say, the phase delay at the frequency corresponding to one time the gain tolerable in the open-loop transfer function of the CMFB is set to 120° at a maximum.

Hereinafter, each phase delay element in the open-loop according to the CMFB will be described. The capacitance parasitically generated at the output terminals 3 and 4 due to line load or the like varies depending on an application used, and may be from approximately several picofarads to a large value of approximately several hundred picofarads (which may vary depending on the cable length or the transmission mode). Accordingly, assuming that the pole that is generated in the common mode output cannot be controlled, there is a phase delay of 90° at a maximum. Since the pole that is generated at the error detector unit 2 can be designed to have a frequency higher than the effective band width of the open-loop transfer function of the CMFB, the stability is not affected. The reason for this is that the maximum value of the effective band width of the open-loop transfer function of the CMFB can be clearly indicated by the pole that is generated in the common mode output.

Next, the phase delay of the CR circuit 1 will be described. The signal from the output terminals 3 and 4 is detected via the resistors R1 and R2 of the CR circuit 1 as a common mode voltage, and is transferred via the resistor R3 to the node1. At that time, due to the low-pass filter effect of the capacitance in the node1 and the resistors R1, R2, and R3, only a low frequency signal of the common mode voltage with phase delay appears at the node1. On the other hand, the capacitors C1 and C2 cause a high frequency signal of the common mode voltage, which cannot pass through the resistors R1 and R2, to bypass the resistors with phase advance and to overlap a signal of the node1. As a result, the CR circuit 1 transmits a low frequency signal that is not greater than a specific frequency of the common mode voltage of the output terminals, with almost no attenuation, to the node1. At that time, the CR circuit 1 causes a high frequency signal that is greater than the specific frequency to be attenuated so that the reactivity of the CMFB with respect to the common high frequency glitch is lowered, and to be transmitted to the node1.

Figures 2A, 2B:
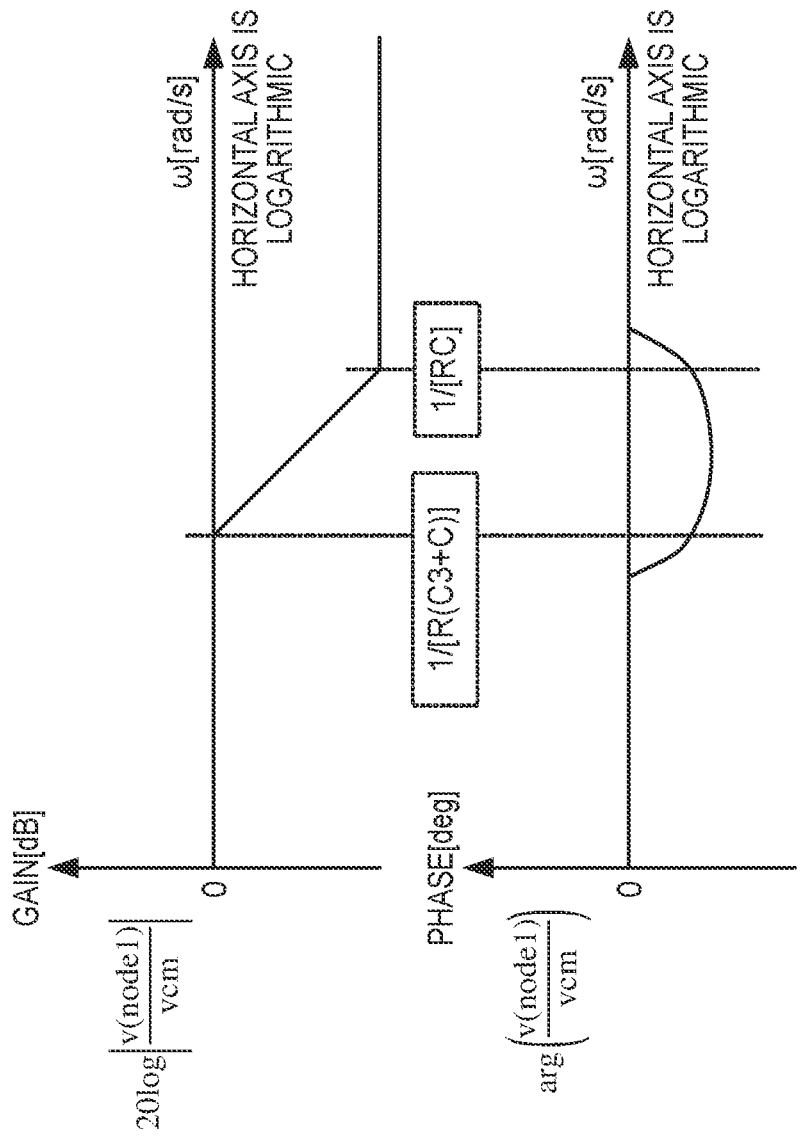
FIGS. 2A and 2B are views showing an example of the Bode plots indicating the input and output characteristics of the circuit configured by resistors and capacitors according to the first embodiment.

FIGS. 2A and 2B are Bode plots of the CR circuit 1 when the common mode voltage of the output terminals 3 and 4 is transmitted to the node1. FIG. 2A shows the gain characteristics, and FIG. 2B shows the phase characteristics. The CR circuit 1 has frequency characteristics in which the phase is delayed in a low frequency range and the delayed phase is compensated for in a high frequency range. Accordingly, if the resistors R1, R2, and R3 and the capacitors C1, C2, and C3 are set following Equations 1 and 2 below, the phase delay at the CR circuit 1 can be set to be not greater than 30° at a maximum.

$$vcm = (v(\text{output3}) + v(\text{output4}))/2 \qquad \text{Equation 1}$$

$$vcm/v(\text{node1}) = (j\omega CR + 1)/(j\omega(C+C3)R + 1) \qquad \text{Equation 2}$$

$$\text{Note that } C = C1 + C2, \ R = (R1*R2)/(R1+R2) + R3 \qquad \text{Equation 2}$$

where ω: angular frequency, and j: imaginary unit.

For example, if the values of the resistors R1, R2, and R3 and the capacitors C1, C2, and C3 are respectively set to 1 kΩ, 1 kΩ, and 10 kΩ, and 0.75 pF, 0.75 pF, and 3 pF, the frequency at which the phase is delayed most is 6 MHz, and the delay amount is 30°. Note that the resistor R3 may be inserted in a case where the symmetric property at a high frequency of the resistor pair consisting of the resistors R1 and R2 is poor, and is not essential. Furthermore, the capacitor C3 may be included in the input capacitor of the error detector unit 2.

Figure 3A:
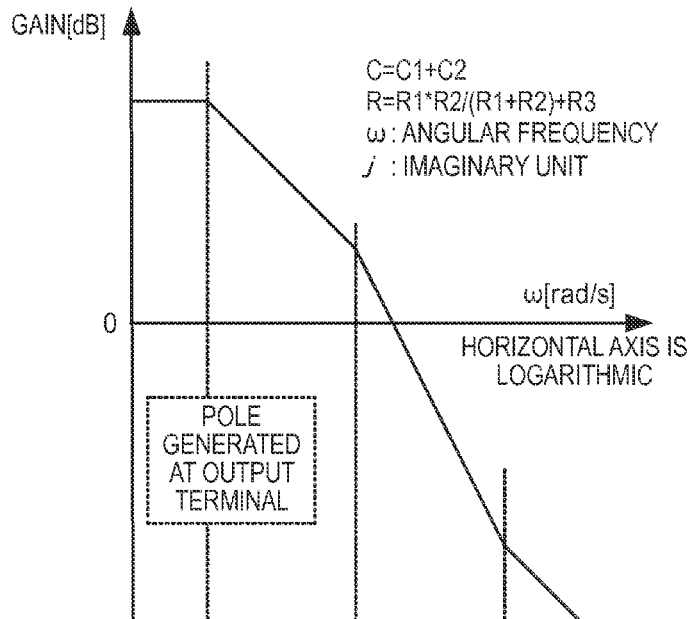
FIGS. 3A and 3B are views showing an example of the Bode plots of the open-loop transfer function of the entire CMFB according to first embodiment.
Figure 3B:
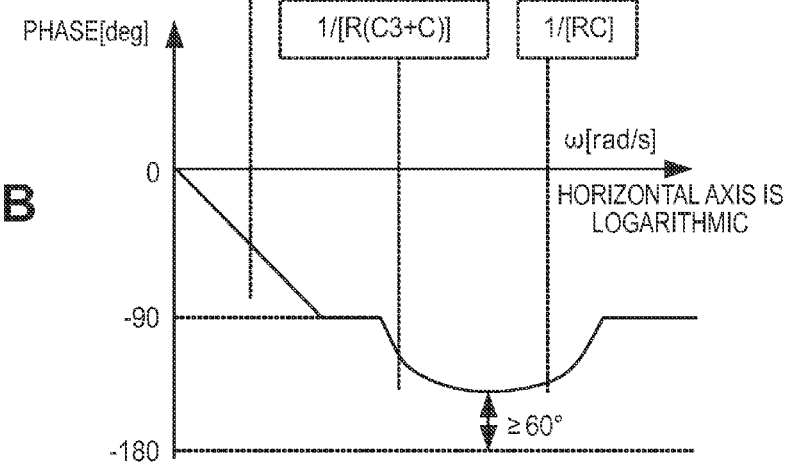

FIGS. 3A and 3B are Bode plots of the open-loop transfer function of the entire CMFB in a case where a large capacitance load is connected to the output terminals 3 and 4 in the circuit configuration in FIG. 1. FIG. 3A shows the gain characteristics, and FIG. 3B shows the phase characteristics. The DC gain in FIG. 3A is determined by a product of the transconductance of the transistor forming the source current source I1 or the sink current source I2 and the output resistance of the output terminals 3 and 4. The main component of the output resistance of the output terminals 3 and 4 is the drain resistance and the source resistance of the transistor forming the source current source I1 or the sink current source I2. Furthermore, the angular frequency of the pole that is generated at the output terminal is the inverse number of a product of the output resistance of the output terminals 3 and 4 and the capacitance present at the output terminal including the load capacitance. If the phase delay amount at the CR circuit 1 is set to be not greater than 30°, assuming that the pole that is generated in the common mode output cannot be controlled, the phase delay of the open-loop can be not greater than 120° at a maximum even in consideration of a phase delay of 90° at a maximum, as shown in FIG. 3B.

In this manner, if the resistors R1, R2, and R3 and the capacitors C1, C2, and C3 are set as appropriate, the phase margin of the CMFB open-loop transfer function can be always get at 60° or more. Accordingly, it is possible to provide differential signal driving always capable of realizing a stable CMFB operation, regardless of the size of the load capacitance of the external load of the transmission line.

Second Embodiment

Figure 4:
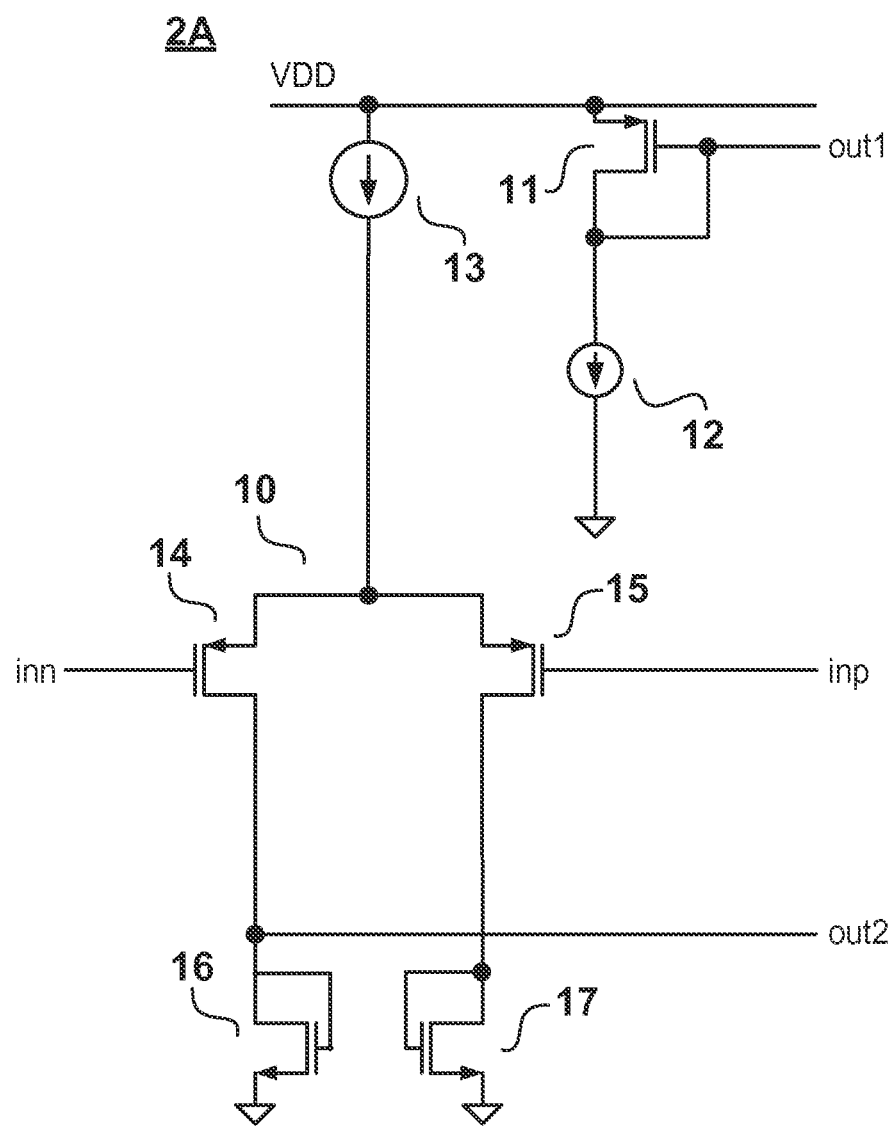
FIG. 4 is a view showing an example of the circuit diagram of an error detector unit according to second embodiment.

Next, an error detector circuit 2A of the error detector unit 2 will be specifically described with reference to FIG. 4. The configuration of this embodiment is as in the first embodiment except for the configuration of the error detector circuit, and, thus, the overlapping description has been omitted. A pMOS transistor 11 has a source connected to the power supply potential VDD, and a gate and a drain connected to each other to form load of a current source 12, and functions as a voltage source that generates a voltage from the gate-drain connecting node. The generated voltage is output from a first control output terminal out1. The voltage from the first control output terminal out1 is input to the gate of the pMOS transistor of the source current source I1, and is used for controlling the source current source I1. A differential amplifier unit 10 of the error detector circuit has a common source differential pair in which sources of two pMOS transistors 14 and 15 are connected in common. A tail current source 13 is connected to the sources of the common source differential pair, and a diode-connected pair of loads 16 and 17 of the nMOS transistors are connected to the drain side of the common source differential pair. The gate terminal of the pMOS transistor 14 that is one transistor forming the common source differential pair is referred to as a first input terminal inn, and the gate terminal of the pMOS transistor 15 that is the other transistor is referred to as a second input terminal inp. The first input terminal inn is taken as an inverting input terminal, and the second input terminal inp is taken as a non-inverting input terminal. A second control output terminal out2 provided at the drain of the pMOS transistor 14 is taken as a non-inverting output terminal. A steady voltage is steadily output from the second control output terminal out2. When the common mode voltage of the H-bridge circuit increases or decreases from the steady state and the voltage of the node1 also increases or decreases, the voltage to the second input terminal inp increases or decreases from the steady state, and the voltage of the second control output terminal out2 also increases or decreases in a similar manner. For example, when the common mode voltage increases from the steady state, the output voltage from the second control output terminal out2 also increases, thereby increasing the current of the sink current source 12, and decreasing the common mode voltage. Since the impedance of the node from the inp to the out2 of the error detector circuit 2A is small, the pole that is generated at this circuit can be set at a high frequency outside the effective band of the CMFB open-loop transfer function, and the entire open-loop transmission system stably operates.

Third Embodiment

Figure 5:
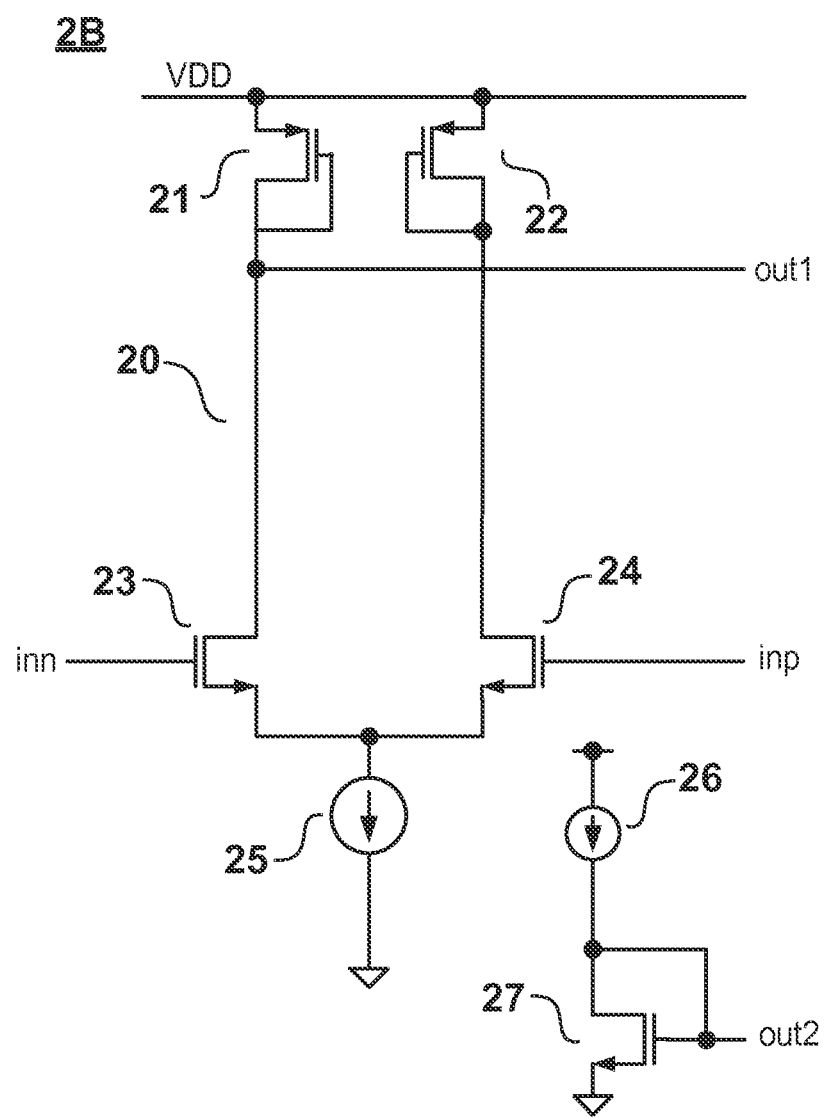
FIG. 5 is a view showing an example of the circuit diagram of the error detector unit according to the third embodiment.

This embodiment shows a second error detector circuit 2B obtained by switching the polarities (p and n) of the transistor elements of the error detector circuit 2A in Example 2. Hereinafter, the error detector circuit 2B of this embodiment will be described with reference to FIG. 5. An nMOS transistor 27 has a source connected to ground, and a gate and a drain diode-connected to form load of a current source 26, and functions as a voltage source that generates a voltage from the gate-drain connecting node. The generated voltage is output from a second control output terminal out2. The voltage from the second control output terminal out2 is input to the gate of the nMOS transistor of the sink current source 12, and is used for controlling the sink current source 12. A differential amplifier unit 20 has a common source differential pair in which sources of two nMOS transistors 23 and 24 are connected in common. A tail current source 25 is connected to the sources of the common source differential pair, and a diode-connected pair of loads 21 and 22 of the pMOS transistors are connected to the drain side of the common source differential pair. The gate of the nMOS transistor 23 that is one transistor forming the common mode differential pair is referred to as a first input terminal inn, and the gate of the nMOS transistor 24 that is the other transistor is referred to as a second input terminal inp. The first input terminal inn is taken as an inverting input terminal, and the second input terminal inp is taken as a non-inverting input terminal. A first control output terminal out1 provided at the drain of the pMOS transistor 21 is taken as a non-inverting output terminal. A steady voltage is steadily output from the first control output terminal out1. When the common mode voltage of the H-bridge circuit increases or decreases from the steady state and the voltage of the node1 also increases or decreases, the voltage to the second input terminal inp increases or decreases from the steady state, and the voltage of the first control output terminal out1 also increases or decreases in a similar manner. As a result, the source current source I1 is controlled, and the common mode voltage is kept in the steady state. For example, when the common mode voltage increases from the steady state, the output voltage from the first control output terminal out1 also increases, thereby decreasing the current of the source current source I1, and decreasing the common mode voltage. Since the pole that is generated at this circuit can be set at a high frequency as in the error detector circuit 2A, the entire open-loop transmission system stably operates.

Fourth Embodiment

Figure 6:
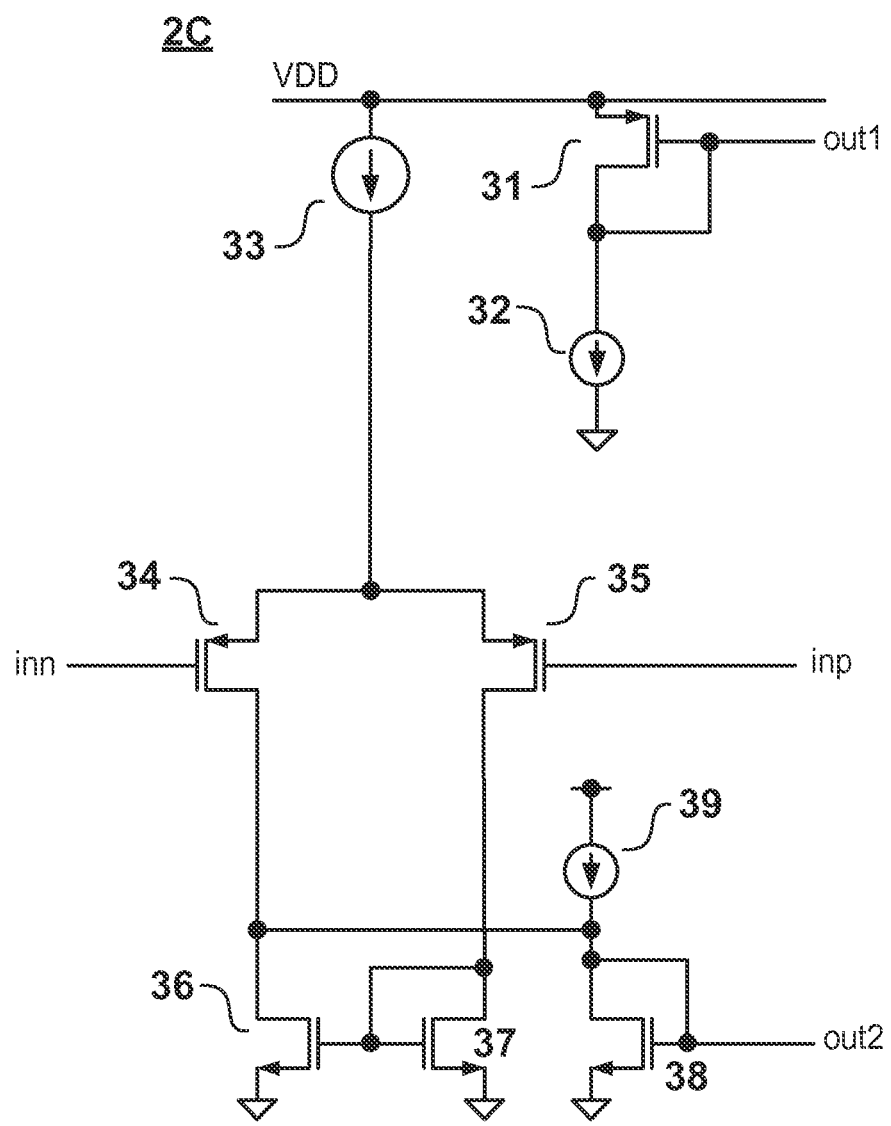
FIG. 6 is a view showing an example of the circuit diagram of the error detector unit according to fourth embodiment.

In this embodiment, a voltage for controlling the current source I2 is generated by causing a voltage in accordance with a change in the common mode voltage to overlap the steady voltage. Hereinafter, an error detector circuit 2C of this embodiment will be described with reference to FIG. 6.

This embodiment is different from the second embodiment, mainly in that an nMOS transistor 38 is provided. The nMOS transistor 38 has a source connected to the ground potential, and a gate and a drain diode-connected to form load, and a current source 39 is connected to the drain-gate connecting node. A voltage is generated at the drain-gate connecting node of the nMOS transistor 38. A drain of a pMOS transistor 34 forming a common source differential pair is connected to the drain of the nMOS transistor 38. A gate of the pMOS transistor 34 is a first input terminal inn that is an inverting input terminal. Non-inverting output is obtained from a second control output terminal out2 to which the gate and the drain of the nMOS transistor 38 are connected. A voltage is supplied from a first control output terminal out1 of the error detector circuit 2C to the source current source I1. A steady voltage is steadily output from the second control output terminal out2. The common source differential pair of the pMOS transistors and the current source load of an nMOS transistor 36 form a transconductance amplifier. The transconductance amplifier of this embodiment is a differential-input single-output transconductance amplifier. In the transconductance amplifier, a current corresponding to a change between the first input terminal inn and the second input terminal inp is output, and the current is converted to a voltage by the impedance of the diode-connected nMOS transistor 38. The voltage obtained by converting the current is overlapped on the second control output terminal out2. Accordingly, the steady bias from the current source 39 to the second control output terminal out2 and the overlapped signal in accordance with a change in the common mode voltage can be separated, and the degree of freedom in setting the gain of the open-loop transfer function of the CMFB is improved compared with the error detector circuit 2A. The pole that is generated at each node can be set in a high frequency range as in the error detector circuits 2A and 2B. The error detector circuit 2C also can have a configuration obtained by switching the p and n polarities of the MOS transistors.

Fifth Embodiment

Figure 7:
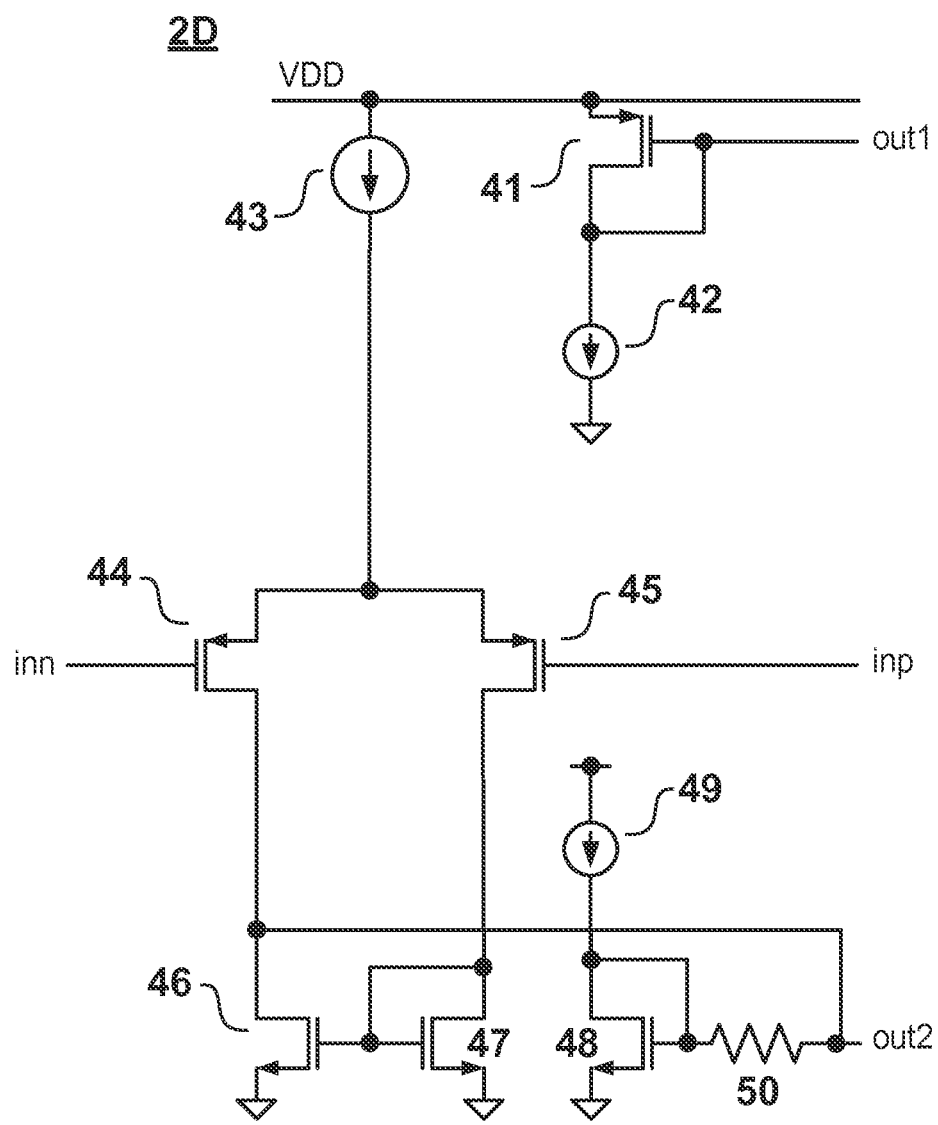
FIG. 7 is a view showing an example of the circuit diagram of the error detector unit according to fifth embodiment.

An error detector circuit 2D of this embodiment is different from the fourth embodiment, in that a resistor 50 is added to the error detector circuit 2C of the fourth embodiment. Hereinafter, this embodiment will be described focusing on aspects different from those in the fourth embodiment, with reference to FIG. 7. An nMOS transistor 48 has a drain and a gate connected to each other to form diode-connection. The nMOS transistor 48 has a source connected to the ground potential, and a current source 49 and one terminal of the resistor 50 are connected to the drain-gate connecting node. A drain of a pMOS transistor 44, whose gate is a first input terminal inn that is an inverting input terminal, of pMOS transistors 44 and 45 forming a common source differential pair, is connected to the other terminal of the resistor 50. A voltage generated by a current that flows from the current source 49 into the diode-connected nMOS transistor 48 is transferred from the drain-gate connecting node via the resistor 50, and is overlapped on the output voltage from the drain of the pMOS transistor 44. Although the basic operation is the same as that in the error detector circuit 2C of Example 4, the impedance of the diode-connected nMOS transistor 48 and series impedance of the additionally provided resistor 50 affect the conversion to a voltage by the transconductance amplifier output current. Accordingly, the degree of freedom in setting the gain is higher than that of the error detector circuit 2C. Also in this embodiment, the pole that is generated at each node can be set at a high frequency as in the error detector circuits 2A, 2B, and 2C. The error detector circuit 2D also can have a configuration obtained by switching the p and n polarities.

Sixth Embodiment

Figure 8:
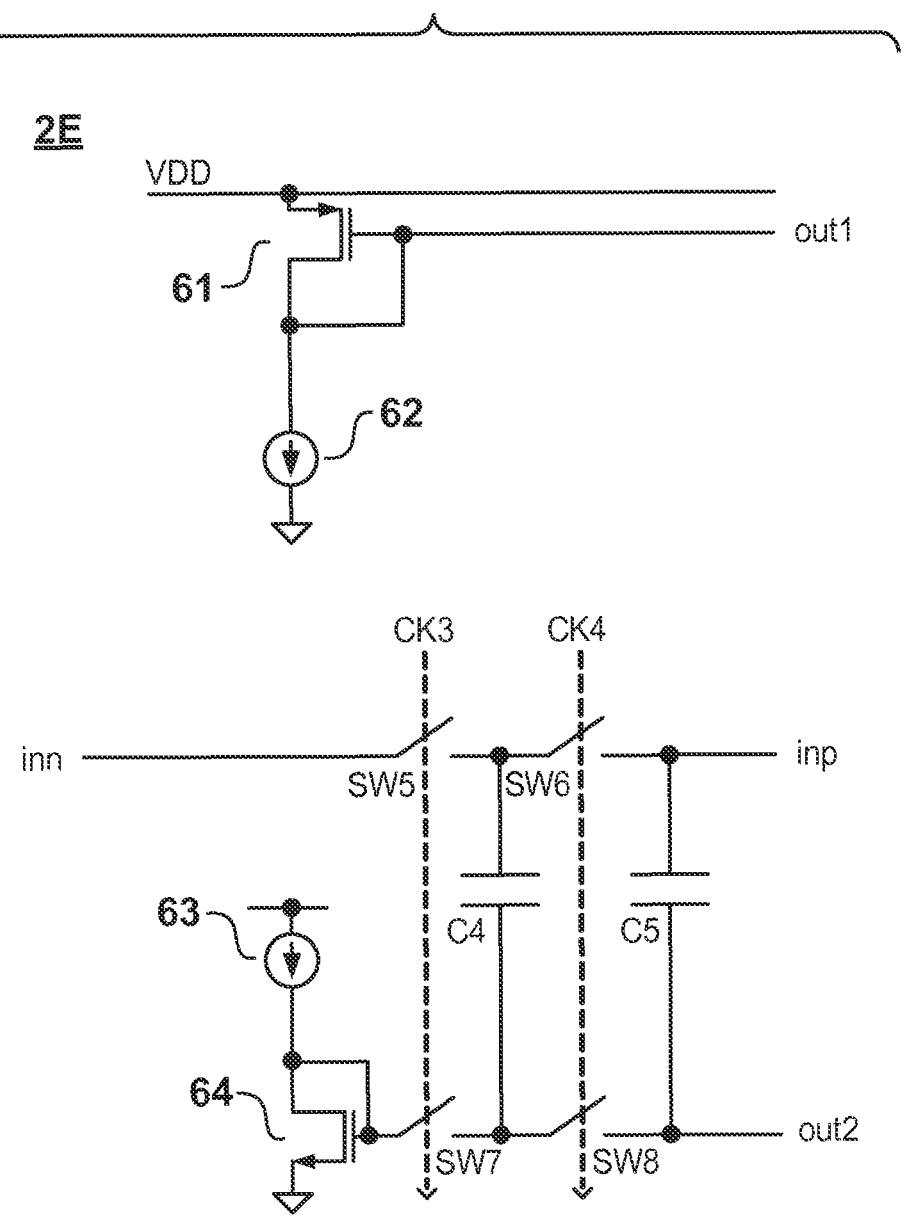
FIG. 8 is a view showing an example of the circuit diagram of the error detector unit according to sixth embodiment.

An error detector circuit 2E of this embodiment is a circuit that obtains a voltage for controlling the current source due to the operation of a switched capacitor. Hereinafter, this embodiment will be described with reference to FIG. 8. A first control output terminal out1 generates a voltage. The voltage from the first control output terminal out1 is generated by a pMOS transistor 61 having a drain and a gate diode-connected, and a current source 62 having one terminal connected to the ground potential and the other terminal connected to the drain-gate connecting node of the pMOS transistor 61. An nMOS transistor 64 has a drain and a gate diode-connected. A current source 63 has one terminal connected to the power supply potential, and the other terminal connected to the diode-connected gate-drain connecting node. A replica voltage is generated from the drain-gate connecting node of the nMOS transistor 64. Note that the replica voltage is a voltage that is substantially equal to the voltage at the gate (i.e., second control output terminal out2) of the nMOS transistor of the sink current source 12 when the common mode voltage is in the steady state. Via switches SW5 and SW7, a reference voltage is given from the first input terminal inn to one terminal of a capacitor C4, and a replica voltage is given to the other terminal. The switches SW5 and SW7 are simultaneously turned on in response to a control signal CK3. As a result, the voltage between both terminals of the capacitor C4 is a difference voltage between the reference voltage and the replica voltage. When the switches SW5 and SW7 are turned off in response to the control signal CK3, switches SW6 and SW8 are turned on in response to a control signal CK4, and the electric charge of the capacitor C4 is supplied via the switches SW6 and SW8 to a capacitor C5.

The control signals CK3 and CK4 are non-overlap two-phase clock, and the clock timing is synchronized with the LVDS data rate. Since the detected common mode voltage is given from the second input terminal inp to the capacitor C5, a voltage in which the common mode voltage is overlapped on the difference between the replica voltage and the reference voltage is generated at the second control output terminal out2. That is to say, the voltage of the second control output terminal out2 is such that out2 voltage=common mode voltage−(reference voltage−replica voltage)=(difference voltage from common mode voltage in steady state)+replica voltage. The voltage of the second control output terminal out2 is used for controlling the sink current source 12, thereby returning the common mode voltage to the steady state. On the path from the second input terminal inp to the second control output terminal out2, there is substantially only capacitive reactance, which is included in the capacitor C3 of the circuit network 1 (the CR circuit 1) configured by resistors and capacitors. Accordingly, generation of the pole in the error detector circuit 2E can be substantially ignored, and a phase margin as described in Example 1 can be get. The error detector circuit 2E also can have a configuration obtained by switching the p and n polarities of the MOS transistors.

As described above, it is possible to provide a differential signal driving circuit always capable of realizing a stable CMFB operation, regardless of the size of the load capacitance of the external load parasitic in the transmission line.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-273172, filed Dec. 27, 2013, which is hereby incorporated by reference herein in its entirety.

What is claimed is:

1. A differential driving circuit, comprising:
a source current source;
a sink current source;
an H-bridge circuit that is connected to the source current source and the sink current source, that has a first output terminal and a second output terminal, and that generates differential output from the first output terminal and the second output terminal;
an error detector unit that adjusts a common mode voltage at the first output terminal and the second output terminal of the H-bridge circuit; and
a circuit network configured by resistors and capacitors connected to the first output terminal and the second output terminal of the H-bridge circuit;
wherein the circuit network is configured such that one terminal of a first resistor and one terminal of a first capacitor are connected to the first output terminal of the H-bridge circuit, one terminal of a second resistor and one terminal of a second capacitor are connected to the second output terminal of the H-bridge circuit, one terminal of a third resistor is connected to the other terminal of the first resistor and the other terminal of the second resistor, one terminal of a third capacitor is connected to the other terminal of the first capacitor, the other terminal of the second capacitor, and the other terminal of the third resistor, and the other terminal of the third capacitor is connected to ground, and
the error detector unit is configured to control at least one of the source current source and the sink current source, based on a voltage generated at a node where the other terminal of the third resistor and the one terminal of the third capacitor are connected to each other, and a reference voltage,
wherein the error detector unit includes a differential amplifier having a first input terminal to which the reference voltage is input and a second input terminal to which the voltage generated at the node where the other terminal of the third resistor and the third capacitor are connected to each other is input, and a voltage source, and
output of the differential amplifier is connected to a control terminal of one of the source current source and the sink current source, and output of the voltage source is connected to the control terminal of the other of the source current source and the sink current source.

2. The differential signal driving circuit according to claim 1, wherein the H-bridge circuit comprises a first switch, a second switch, a third switch, and a fourth switch,
the first switch and the third switch are connected to the first output terminal, and the second switch and the fourth switch are connected to the second output terminal, and
the first switch and the second switch turns on and off in a complementary operation, and the third switch and the fourth switch turns on and off in the complementary operation.

3. The differential signal driving circuit according to claim 1, wherein the H-bridge circuit comprises a first switch, a second switch, a third switch, and fourth switch,
one terminal of the first switch and one terminal of the second switch are connected to the source current source, and one terminal of the third switch and one terminal of the fourth switch are connected to the sink current source, and
the other terminal of the first switch and the other terminal of the third switch are connected to the first output terminal, and the other terminal of the second switch and the other terminal of the fourth switch are connected to the second output terminal.

4. The differential signal driving circuit according to claim 1, the H-bridge circuit further comprising a first terminal and a second terminal, wherein one terminal of the source current source is connected to a supply voltage potential, the other terminal of the source current source is connected to the first terminal of the H-bridge circuit, one terminal of the sink current source is connected to a ground, and the other terminal of the sink current source is connected to the second terminal of the H-bridge circuit.

5. A differential driving circuit, comprising:
a source current source;
a sink current source;
an H-bridge circuit that is connected to the source current source and the sink current source, that has a first output terminal and a second output terminal, and that generates differential output from the first output terminal and the second output terminal;
an error detector unit that adjusts a common mode voltage at the first output terminal and the second output terminal of the H-bridge circuit; and
a circuit network configured by resistors and capacitors connected to the first output terminal and the second output terminal of the H-bridge circuit;
wherein the circuit network is configured such that one terminal of a first resistor and one terminal of a first capacitor are connected to the first output terminal of the H-bridge circuit, one terminal of a second resistor and one terminal of a second capacitor are connected to the second output terminal of the H-bridge circuit, one terminal of a third resistor is connected to the other terminal of the first resistor and the other terminal of the second resistor, one terminal of a third capacitor is connected to the other terminal of the first capacitor, the other terminal of the second capacitor, and the other terminal of the third resistor, and the other terminal of the third capacitor is connected to ground, and
the error detector unit is configured to control at least one of the source current source and the sink current source, based on a voltage generated at a node where the other terminal of the third resistor and the one terminal of the third capacitor are connected to each other, and a reference voltage,
wherein the error detector unit includes a differential-input single-output transconductance amplifier having a first input terminal to which the reference voltage is input and a second input terminal to which the voltage generated at the node where the other terminal of the third resistor and the third capacitor are connected to each other is input, a first voltage source, and a second voltage source, and
output of the differential-input single-output transconductance amplifier is overlapped on output of the first voltage source and is connected to a control terminal of one of the source current source and the sink current source, and output of the second voltage source is connected to the control terminal of the other of the source current source and the sink current source.

6. A differential driving circuit, comprising:
a source current source;
a sink current source;
an H-bridge circuit that is connected to the source current source and the sink current source, that has a first output terminal and a second output terminal, and that generates differential output from the first output terminal and the second output terminal;

an error detector unit that adjusts a common mode voltage at the first output terminal and the second output terminal of the H-bridge circuit; and a circuit network configured by resistors and capacitors connected to the first output terminal and the second output terminal of the H-bridge circuit;

wherein the circuit network is configured such that one terminal of a first resistor and one terminal of a first capacitor are connected to the first output terminal of the H-bridge circuit, one terminal of a second resistor and one terminal of a second capacitor are connected to the second output terminal of the H-bridge circuit, one terminal of a third resistor is connected to the other terminal of the first resistor and the other terminal of the second resistor, one terminal of a third capacitor is connected to the other terminal of the first capacitor, the other terminal of the second capacitor, and the other terminal of the third resistor, and the other terminal of the third capacitor is connected to ground, and the error detector unit is configured to control at least one of the source current source and the sink current source, based on a voltage generated at a node where the other terminal of the third resistor and the one terminal of the third capacitor are connected to each other, and a reference voltage, wherein the error detector unit includes a differential-input single-output transconductance amplifier having a first input terminal to which the reference voltage is input and a second input terminal to which the voltage generated at the node where the other terminal of the third resistor and the third capacitor are connected to each other is input, a first voltage source, and a second voltage source, and output of the differential-input single-output transconductance amplifier is overlapped via a resistor on output of the first voltage source and is connected to a control terminal of one of the source current source and the sink current source, and output of the second voltage source is connected to the control terminal of the other of the source current source and the sink current source.

* * * * *